United States Patent [19]

Matsumura et al.

[11] Patent Number: 5,377,142
[45] Date of Patent: Dec. 27, 1994

[54] SEMICONDUCTOR MEMORY HAVING DATA PRESET FUNCTION

[75] Inventors: Tetsuya Matsumura; Masahiko Yoshimoto; Keisuke Okada, all of Hyogo, Japan

[73] Assignee: Mitsubishi Denki Kabushiki Kaisha, Tokyo, Japan

[21] Appl. No.: 45,391

[22] Filed: Apr. 13, 1993

[30] Foreign Application Priority Data

Aug. 12, 1992 [JP] Japan .................................. 4-215119

[51] Int. Cl.⁵ .............................................. G11C 7/00
[52] U.S. Cl. .............................. 365/189.01; 365/149; 365/230.06
[58] Field of Search ................... 365/149, 51, 63, 154, 365/190, 189.01, 189.08, 230.06

[56] References Cited

U.S. PATENT DOCUMENTS

| | | | |
|---|---|---|---|
| 4,935,896 | 6/1990 | Matsumura et al. | 365/149 X |
| 4,970,689 | 11/1990 | Kenney | 365/149 X |
| 5,029,141 | 7/1991 | Yoshimoto et al. | 365/230.03 |
| 5,040,143 | 8/1991 | Matsumura et al. | 365/51 |

Primary Examiner—Joseph A. Popek
Attorney, Agent, or Firm—Lowe, Price, LeBlanc & Becker

[57] ABSTRACT

A DRAM having a data preset function is disclosed. A memory cell includes connectors which are formed of contact holes or through holes and which can be selectively formed in order to program preset data. For example, when preset data "0" is programmed, connectors are formed, and connector 17 is not formed. When a data precharge signal of a high level is applied, a transistor is turned on and as a result, a data storage capacitor is discharged. In other words, predetermined data is written into capacitor. Thus, the DRAM having the data preset function is provided.

16 Claims, 12 Drawing Sheets

SEMICONDUCTOR MEMORY HAVING DATA PRESET FUNCTION

BACKGROUND OF THE INVENTION

1. Field of the Invention

The present invention relates generally to semiconductor memories, and more particularly, to a semiconductor memory having a data preset function. The present invention has particular applicability to digital signal processing LSI devices.

2. Description of the Background Art

A digital signal processing LSI device for processing digital signals has been known widely. For example, in the field of video signal processing, the digital signal processing LSI device for processing video data at a high speed is often used. The digital signal processing LSI device usually uses various memories such as a line memory, a field memory, or a frame memory. In order to configure these memories, a dynamic random access memory (hereinafter referred to as a "DRAM") is provided in the digital signal processing LSI device.

Generally, a conventional DRAM stores externally applied data and provides the stored data. Therefore, desired data is not stored without writing data, causing desired data not to be provided from the DRAM.

It is often necessary to set predetermined data in the digital signal processing LSI device. For example, in the field of video signal processing, in order to adjust a television receiver, predetermined data, that is, test data for indicating color bar or cross hatch is required. The conventional digital signal processing LSI device does not have a function of producing such predetermined data in itself, so that it is necessary to provide such data from an external circuit such as a CPU. In other words, an external device is required for supplying predetermined data to the digital signal processing LSI device; however, addition of such an external device incurs increase in scale and complication.

FIG. 17 is a schematic diagram of a circuit showing one example of a memory cell in the conventional DRAM. A memory cell 10 shown in FIG. 17 is disclosed in U.S. Pat. No. 4,935,869. Referring to FIG. 17, memory cell 10 includes a capacitor 14 for storing a data signal, and three NMOS transistors 11, 12 and 13. Transistor 11 is turned on in response to a signal on a write word line WW, and applies a data signal on a write bit line WB to capacitor 14. Transistor 12 is turned on or off in response to the data signal stored by capacitor 14. Transistor 13 is turned on in response to a signal on a read word line RW, and selectively pulls down a read bit line RB in accordance with the stored data signal.

In a data writing operation, the write word line WW is brought to a high level. Since transistor 11 is turned on, the data signal on the write bit line WB is applied to capacitor 14. In other words, capacitor 14 is charged or discharged by a signal charge on the write bit line WB.

When capacitor 14 is charged to a power supply voltage level (i.e. a high level), transistor 12 is brought to an on state in reading data. On the other hand, when capacitor 14 is discharged to a ground voltage level (i.e. a low level), transistor 12 is brought to an off state in reading data.

In a data reading operation, after the read bit line RB is precharged, the read word line RW is brought to a high level. Since transistor 13 is turned on, the potential of the read bit line WB is changed in accordance with the conductive state of transistor 12. In other words, when transistor 12 is turned on, the potential of the read bit line RB is pulled down through transistors 12 and 13. Conversely, when transistor 12 is turned off, the potential of the read bit line RB is not changed, that is, maintained. After conduction of transistor 13, by detecting the potential of the read bit line RB by a sense amplifier, not shown, the data signal stored in memory cell 10 is read out.

FIG. 18 is a schematic diagram of a circuit showing another example of a memory cell in the conventional DRAM. Referring to FIG. 18, a memory cell 20 includes a capacitor 23 for storing a data signal, and two NMOS transistors 21 and 22. Transistor 21 connects a first bit line BL1 to capacitor 23 in response to a signal on a first word line WL1. Similarly, transistor 22 connects a second bit line BL2 to capacitor 23 in response to a signal on a second word line WL2. In other words, memory cell 20 can be accessed through two access ports (not shown).

When memory cell 20 is accessed through a first access port, the word line WL1 is brought to a high level. Since transistor 21 is turned on, capacitor 23 is charged or discharged in accordance with the potential of the bit line BL1 in the writing operation. In the reading operation, after the bit line BL1 is brought to Vcc/2 in advance, the word line WL1 is brought to a high level. Therefore, the potential of the bit line BL1 is changed in accordance with an electric charge stored in capacitor 23. By detecting potential change of the bit line BL1 by a sense amplifier, not shown, the data signal stored in memory cell 20 is read out. On the other hand, data writing and data reading through a second access port can be carried out in the same manner as described above.

FIG. 19 is a schematic diagram of a circuit showing still another example of a memory cell in the conventional DRAM. Referring to FIG. 19, a memory cell 30 includes a capacitor 32 for storing a data signal, and an NMOS transistor 31. In the data writing operation, the word line WL is brought to a high level. Since transistor 31 is turned on, capacitor 32 is charged or discharged in accordance with the potential of the bit line BL. On the other hand, in the data reading operation, after the bit line BL is precharged to Vcc/2, the word line WL is brought to a high level. Since transistor 31 is turned on, the potential of the bit line BL is changed in accordance with the stored data signal. By detecting potential change of the bit line BL by a sense amplifier, not shown, the data signal is read out.

As shown in FIGS. 17, 18 and 19, conventional DRAM memory cells 10, 20 and 30 only store an applied data signal, and only provide the stored data signal. These memory cells 10, 20 and 30 are used in the above-mentioned digital signal processing LSI device, so that these memory cells cannot provide such data without writing predetermined data. This is also the case with a static random access memory (SRAM).

SUMMARY OF THE INVENTION

One object of the present invention is to provide a semiconductor memory having a data preset function for providing predetermined data.

In brief, the semiconductor memory in accordance with the present invention includes a memory cell array including a plurality of memory cells arranged in rows and columns, a plurality of word lines each connected to a memory cell in a corresponding one of the rows in the memory cell array, and a plurality of bit lines each connected to memory cells in a corresponding one of the columns in the memory cell array. Each memory cell includes a capacitor for storing a data signal, a switching circuit connected between a corresponding one of the bit lines and the capacitor and operated in response to a signal on a corresponding one of the word lines, and a predetermined data supplying circuit for supplying a predetermined data signal to the capacitor in response to an externally applied preset requesting signal.

In operation, the predetermined data supplying circuit provided in each memory cell supplies the predetermined data signal to the capacitor in response to the externally applied preset requesting signal. Therefore, regardless of the stored data signal, the predetermined data signal can be read out.

In accordance with another aspect of the present invention, the semiconductor memory includes a memory cell array including a plurality of memory cells arranged in rows and columns. The memory cell array can store arbitrary data and provide the stored data in the first operation state. The memory cell array can only provide the predetermined data in the second operation state. The semiconductor memory further includes an operation state control circuit for controlling the operation state of the memory cell array in response to an externally applied operation state control signal.

In operation, the operation state control circuit changes the operation state of the memory cell array into the first or the second operation state in response to the externally applied operation state control signal. In other words, since the memory cell array can provide the predetermined data in the second operation state, the data preset function can be implemented.

In accordance with still another aspect of the present invention, the semiconductor memory includes a memory cell connected to first and second word lines and first and second bit lines. The memory cell includes a capacitor for storing a data signal, a first switching element connected between the first bit line and the capacitor and operated in response to a signal on the first word line, a second switching element connected between the second bit line and the capacitor and operated in response to a signal on the second word line, and a predetermined data supplying circuit for supplying a predetermined data signal to the capacitor in response to an externally applied preset requesting signal.

In operation, the predetermined data supplying circuit provided in the memory cell supplies the predetermined data signal to the capacitor in response to the externally applied preset requesting signal. Therefore, regardless of the stored data signal, the predetermined data signal can be read out.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
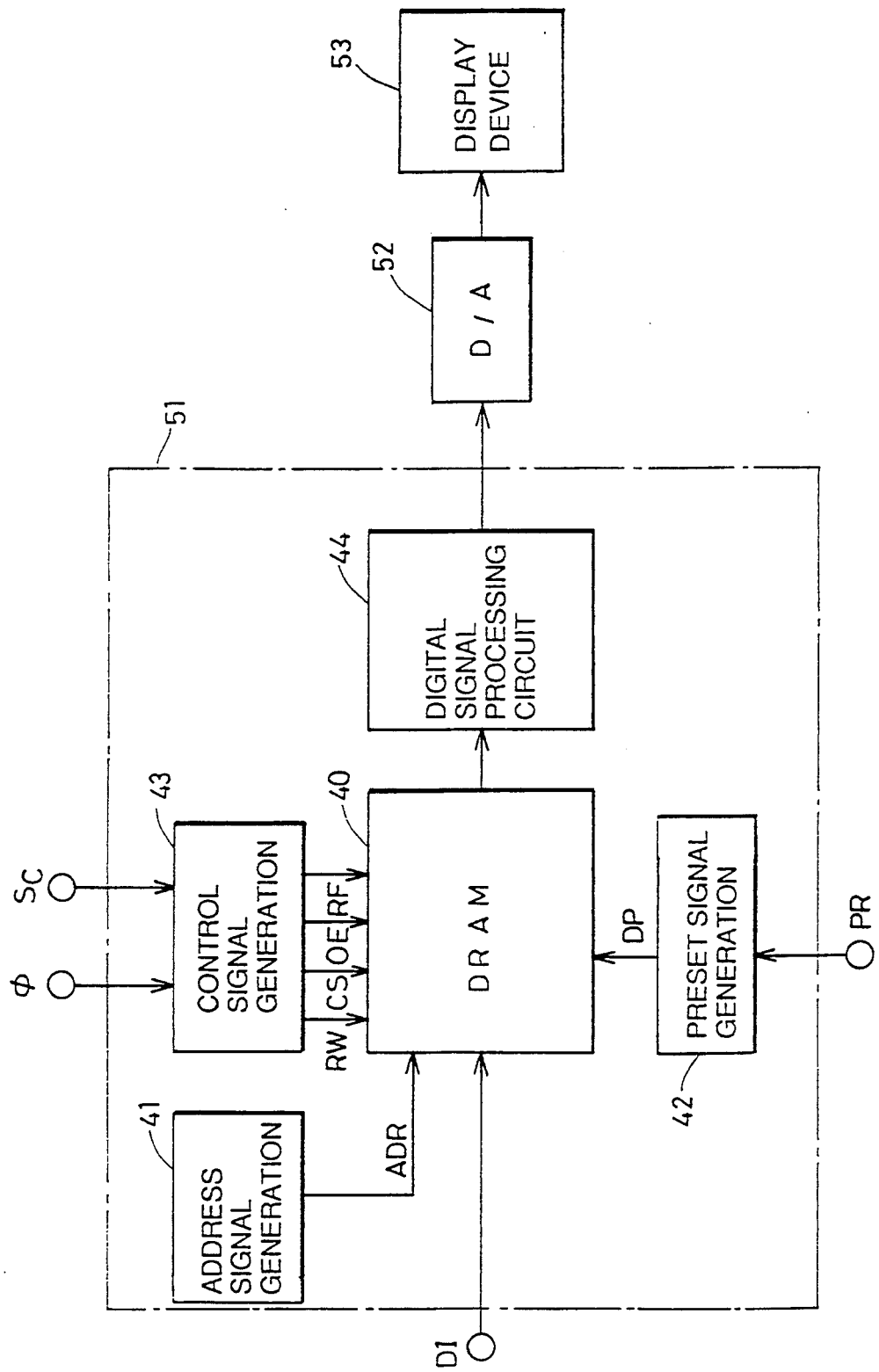
FIG. 1 is a block diagram of a digital signal processing LSI device showing one embodiment of the present invention.

Referring to FIG. 1, a digital signal processing LSI device 51 includes a dynamic random access memory circuit (hereinafter referred to as a "DRAM") 40 for storing data, and a digital signal processing circuit 44 conducting digital signal processing for data provided from DRAM 40. A line 51 shows a semiconductor substrate.

An address signal generating circuit 41 generates an address signal ADR for designating a memory cell to be accessed in DRAM 40. A control signal generating circuit 43 generates various control signals for controlling DRAM 40, such as a read/write control signal RW, a chip select signal CS, an output enable signal OE, a refresh control signal RF and the like. Control signal generating circuit 43 is responsive to an externally applied clock signal $\phi$ and a control signal Sc for generating these internal control signals RW, CS, OE, RF and the like. DRAM 40 receives an input data signal DI to be stored through a data input terminal.

Digital signal processing LSI drive 51 further includes a preset signal generating circuit 42 for generating a data preset signal DP in response to an externally applied preset requesting signal PR. DRAM 40 provides predetermined preset data in response to the preset signal DP (the operation of which will be described in details later).

A D/A converter 52 converts output data provided from digital signal processing circuit 44 into an analog video signal. The converted video signal is applied to a display device 23 to display a desired video.

Figure 2:
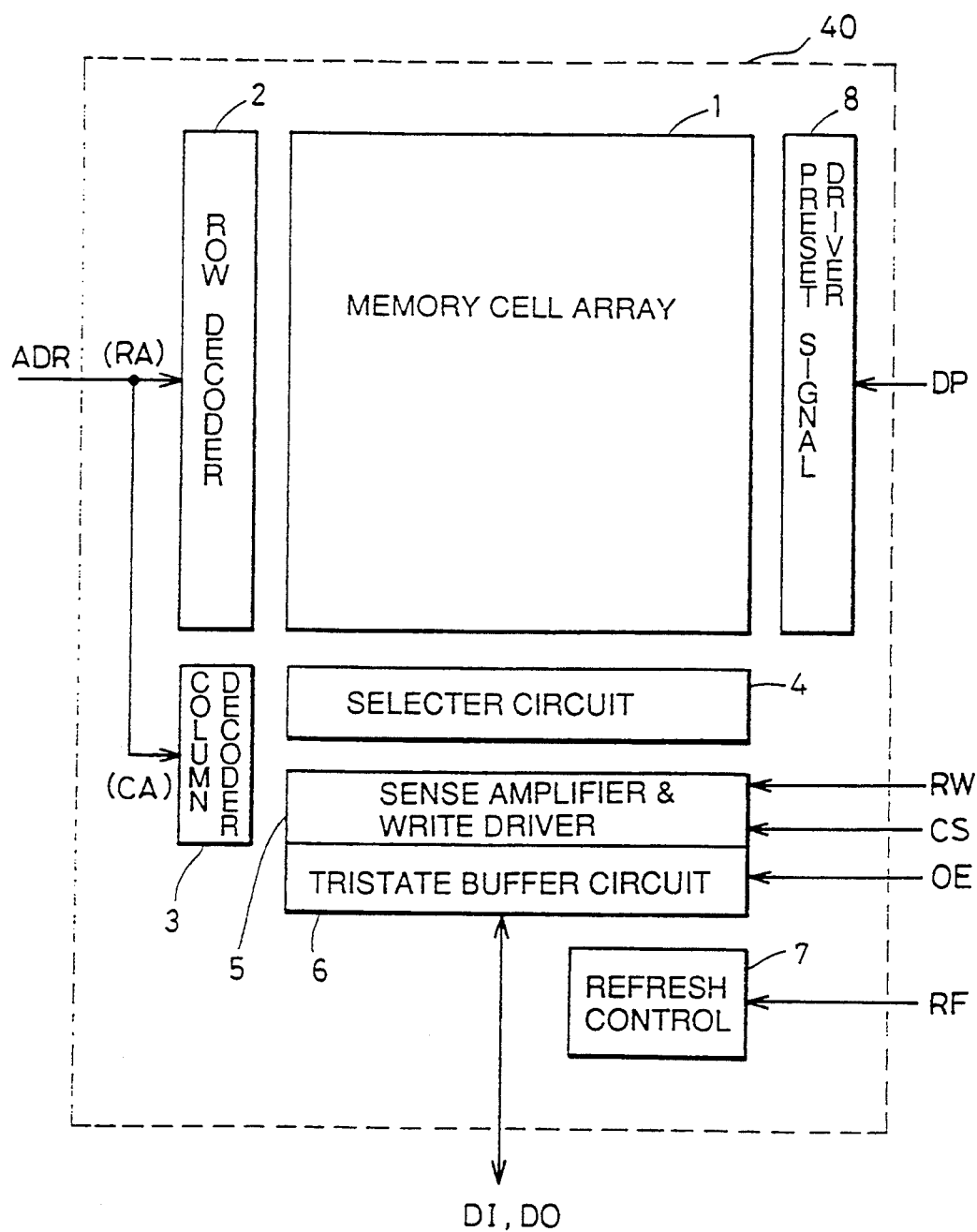
FIG. 2 is a circuit block diagram of a DRAM shown in FIG. 1.

FIG. 2 is a circuit block diagram of DRAM 40 shown in FIG. 1. Referring to FIG. 2, DRAM 40 includes a memory cell array 1 including a memory cell (not shown) arranged in rows and columns, a row decoder 2 for selecting the rows in memory cell array 1, a column decoder 3 for selecting the columns in memory cell array 1, a selector circuit 4 for selecting a bit line to be accessed in response to an output signal from column decoder 3, a sense amplifier and write driver 5 connected to a bit line (not shown) in memory cell array 1 through selector circuit 4, a tristate buffer circuit 6 for applying/providing input data DI and output data DO, respectively, a refresh control circuit 7, and a preset signal driver 8 for driving a preset signal line (not shown) in memory cell array 1.

Row decoder 2 decodes the row address signal RA, and selectively activates one word line (not shown) in memory cell array 1. Column decoder 3 decodes the column address signal CA, and selectively renders one switching circuit (not shown) in selector circuit 4 conductive. Sense amplifier and write driver 5 is operated in response to the read/write control signal RW and the chip select signal CS. Tristate buffer circuit 6 operates in response to the output enable signal OE. Refresh control circuit 7 controls a refresh operation in memory cell array 1 in response to the refresh control signal RF. Preset signal driver 8 drives a preset signal line (not shown) in memory cell array 1 in response to the preset signal DP.

Figure 3:
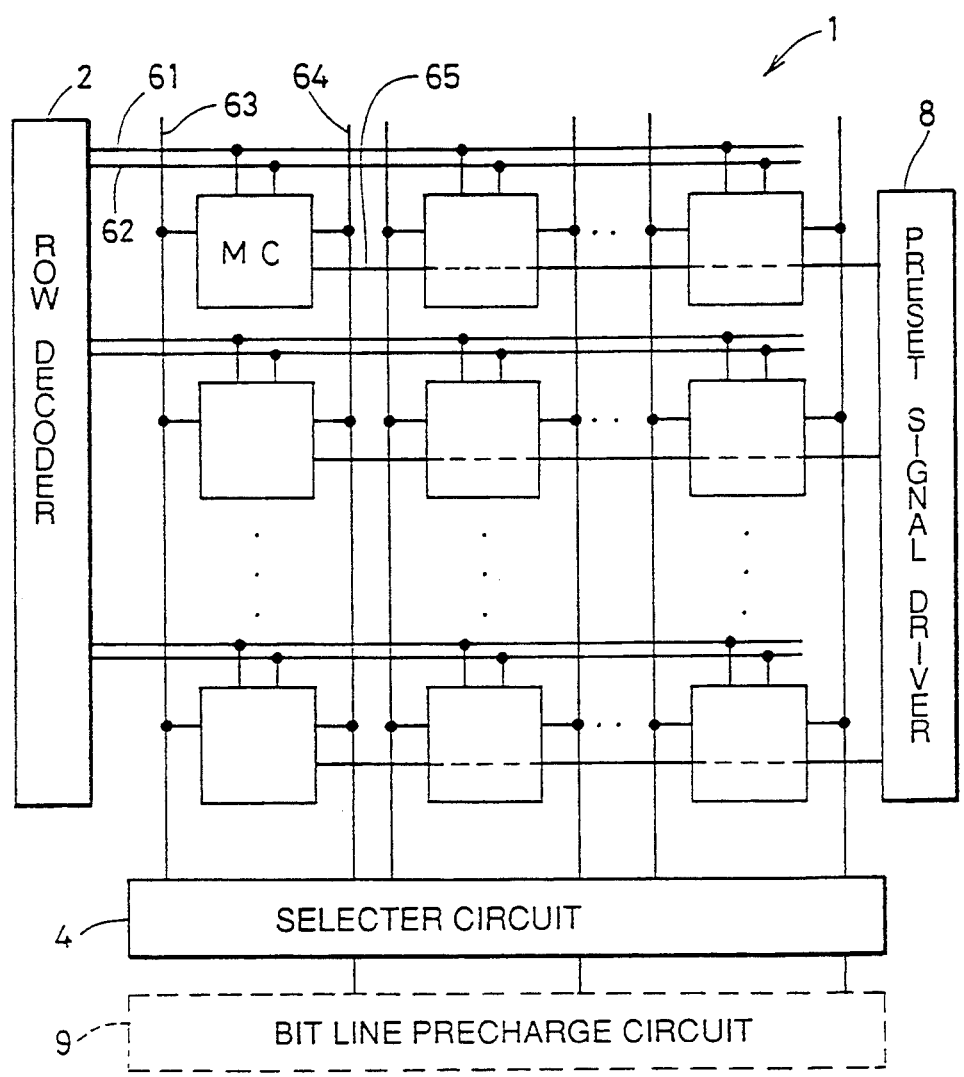
FIG. 3 is a circuit block diagram of a memory cell array shown in FIG. 2.

FIG. 3 is a circuit block diagram of memory cell array 1 shown in FIG. 2. Referring to FIG. 3, memory cell array 1 includes a plurality of memory cells MC arranged in rows and columns. For example, one memory cell MC is connected to first and second word lines 61, 62, first and second bit lines 63, 64, and a preset signal line 65. The first and the second word lines are driven or activated by a word line driving circuit (not shown) provided in a row decoder 23. The first and the second bit lines 63 and 64 are connected to selector circuit 4. Preset signal line 65 is connected to a memory cell in each row in memory cell array 1. In other words, the preset signal line is provided in every row in memory cell array 1, and all of the preset signal lines are simultaneously driven by preset signal driver 8.

Figure 4:
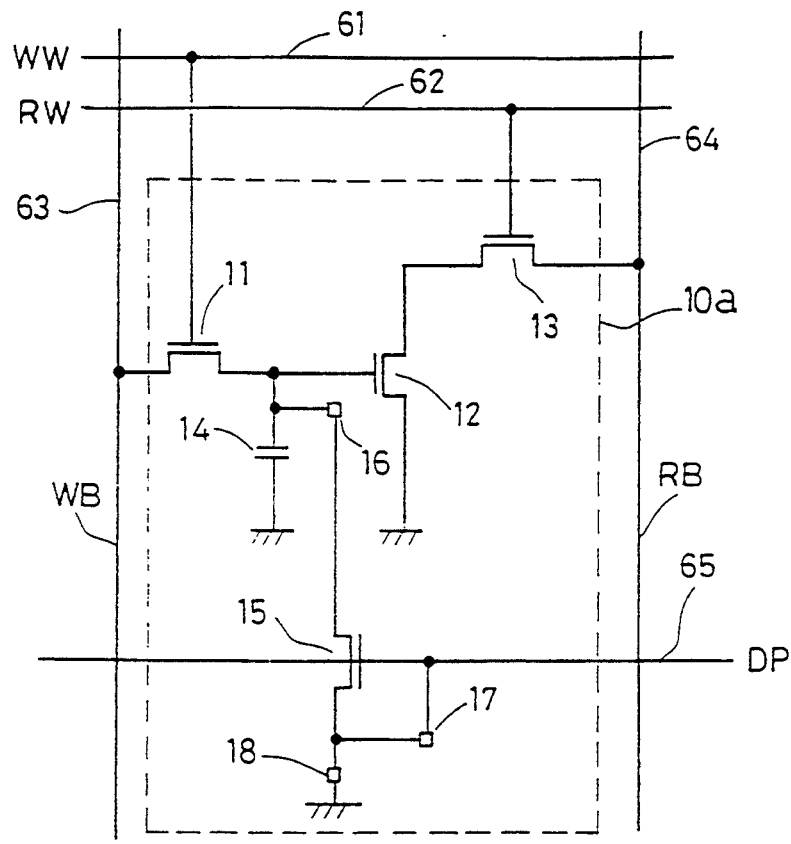
FIG. 4 is a schematic diagram of a circuit of one memory cell shown in FIG. 3.

FIG. 4 is a schematic diagram of a circuit of a memory cell shown in FIG. 3. Referring to FIG. 4, a memory cell 10a includes a capacitor 14 for storing a data signal, four NMOS transistors 11 to 15, and three connectors (or connection nodes) 16 to 18. The write word line WW and the read word line RW shown in FIG. 4 correspond to word lines 61 and 62 shown in FIG. 3, respectively. The write bit line WB and the read bit line RB correspond to bit lines 63 and 64 shown in FIG. 3, respectively.

Transistor 11 is turned on in response to a signal on the write word line WW, and applies a write data signal on the write bit line WB to capacitor 14. Transistor 12 is turned on or o#f in response to the charge state of capacitor 14 in reading data. Transistor 13 is turned on in response to a signal on the read word line RW. Therefore, in the reading operation, the potential of the read bit line RB is pulled down or maintained in accordance with the stored data.

Figure 17:
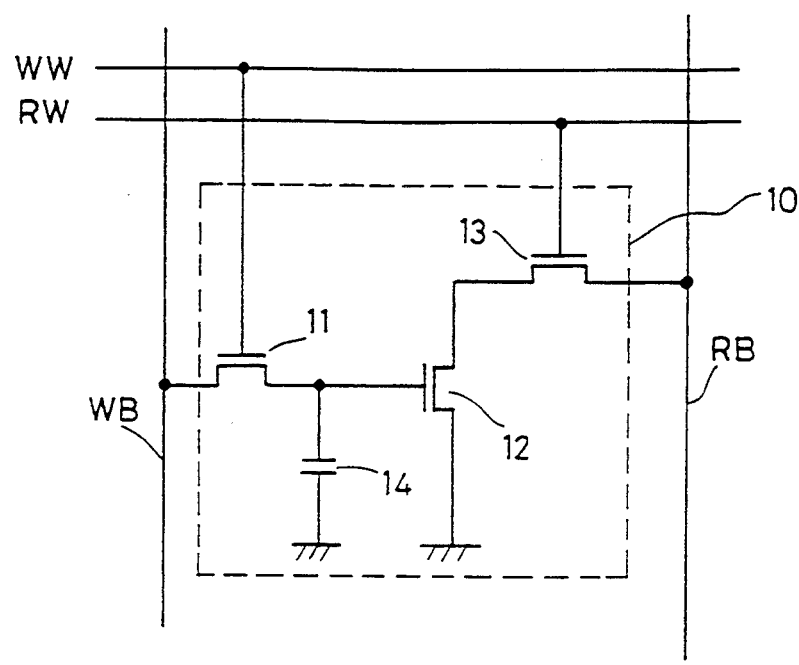
FIG. 17 is a schematic diagram of a circuit showing one example of a memory cell in the conventional DRAM.

Although the above-described data writing operation and data reading operation are similar to those of memory cell 10 shown in FIG. 17, memory cell 10a shown in FIG. 4 has a data preset function as in the following. Each of connectors 16, 17 and 18 is, as will be described later, formed by contact holes or through holes in the embodiments. Provision of connector 16 connects one electrode of capacitor 14 to the drain of transistor 15. Provision of connector 17 connects the gate of transistor 15 to the source. Provision of connector 18 causes the source of transistor 15 to be grounded. These connectors 16, 17 and 18, formed selectively in the manufacturing step, implement a data preset operation as in the following.

Table 1 shows the relation between provision of connectors and data to be programmed.

TABLE 1

| case | preset data | connector 16, 25, 34 | connector 17, 26, 35 | connector 18, 27, 36 |
|---|---|---|---|---|
| 1 | none | Δ | — | — |
| 2 | "0" | o | Δ | o |
| 3 | "1" | o | o | Δ |

Referring to table 1, "o" to indicates that connectors are provided, and "Δ" indicates that connectors are not provided.

In case 1, connector 16 in memory cell 10a is not formed. Therefore, since the drain of transistor 15 is not connected to capacitor 14, memory cell 10a carries out substantially the same operation as memory cell 10 shown in FIG. 17, regardless of provision of the data preset signal DP. Therefore, even if the data preset signal DP of a high level is applied from preset signal driver 8 shown in FIG. 3, the charge state of capacitor 14 is not changed, and the stored data signal is maintained.

In case 2, connectors 16 and 18 are formed, while connector 17 is not formed. As a result, predetermined data "0" is programmed in memory cell 10a as preset data. In other words, when the data preset signal DP of a high level is applied, transistor 15 is turned on. Therefore, capacitor 14 is discharged, forcing data "0" to be written into memory cell 10a. Data written in the reading operation, that is, predetermined or programmed data, is provided from memory cell 10a.

In case 3, connectors 16 and 17 are formed, while connector 18 is not formed. As a result, predetermined data "1" is programmed in memory cell 10a. When the high level data preset signal DP is applied, the gate and the source of transistor 15 are brought to a high level. Therefore, since transistor 15 is turned on, capacitor is charged to a high level voltage, whereby data "1" stored in the data "1" operation in memory cell 10a is provided.

Figure 5:
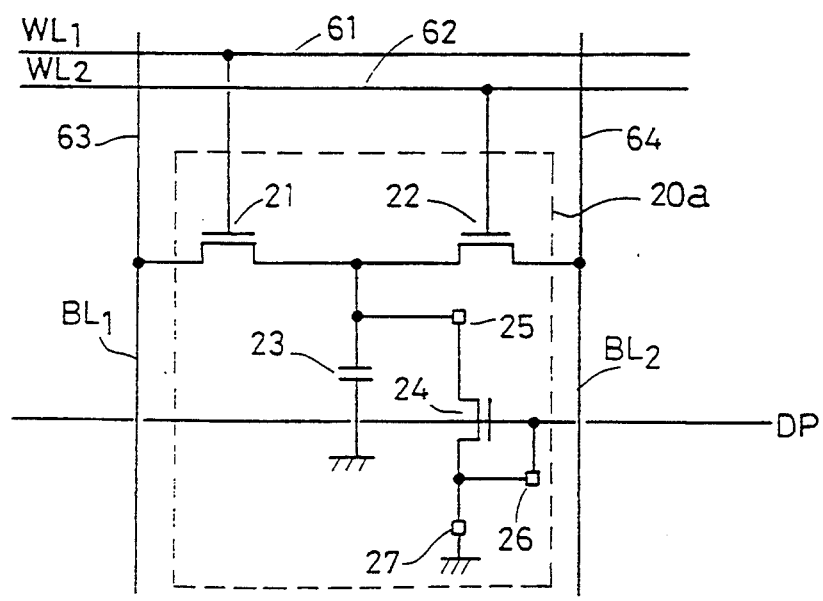
FIG. 5 is a schematic diagram of a circuit of a memory cell showing another embodiment of the present invention.

FIG. 5 is a schematic diagram of a circuit of a memory cell showing another embodiment of the present invention. Referring to FIG. 5, a memory cell 20a includes a capacitor 23 for storing data, NMOS transistors 21, 22 and 24, and connectors 25, 26 and 27 which can be selectively formed. First and second word lines WL1 and WL2 shown in FIG. 5 correspond to word lines 61 and 62 shown in FIG. 3, respectively. Bit lines BL1 and BL2 correspond to bit lines 63 and 64 shown in FIG. 3, respectively. The data preset operation in memory cell 20a can also be described similar to that of memory cell 10a, referring to the above-mentioned table 1.

Figure 18:
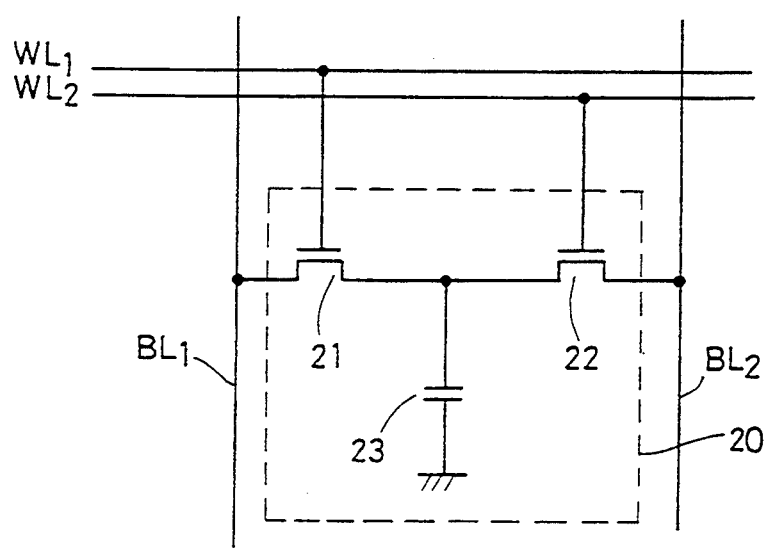
FIG. 18 is a schematic diagram of a circuit showing another example of a memory cell in the conventional DRAM.

In case 1, connector 25 is not formed. Therefore, one electrode of capacitor 23 is not connected to the drain of transistor 24. As a result, even if the data preset signal DP of a high level is applied, a data signal stored by capacitor 23 is not changed. In case 1, the data writing operation and the data reading operation similar to those of memory cell 20 shown in FIG. 18 are carried out.

In case 2, connectors 25 and 27 are formed, while connector 26 is not formed. When the data preset signal DP of a high level is applied, transistor 24 is turned on. As a result, capacitor 23 is forcibly discharged. This results in writing of predetermined data "0" in memory cell 20a, causing written data to be provided in a reading operation.

In case 3, connectors 25 and 26 are formed, while connector 27 is not formed. When the data preset signal DP of a high level is applied, a high level voltage is applied to the gate and the source of transistor 24. Since transistor 24 is turned on, capacitor 23 is charged by the high level voltage. This results in writing of predetermined data "1" in capacitor 23. The written data "1" is provided in the reading operation.

Figure 7:
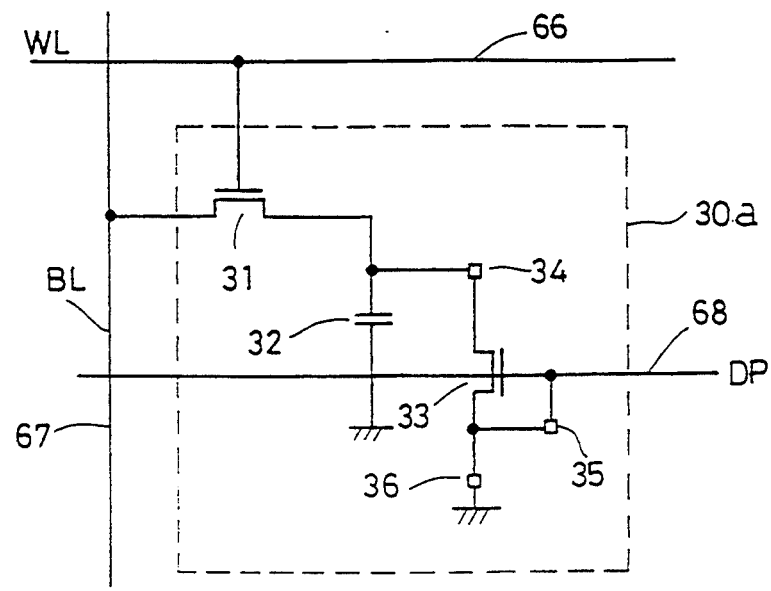
FIG. 7 is a schematic diagram of a circuit of a memory cell showing still another embodiment of the present invention.

FIG. 7 is a schematic diagram of a circuit of a memory cell showing still another embodiment of the present invention. Referring to FIG. 7, a memory cell 30a includes a capacitor 32 for storing data, NMOS transistors 31 and 33, and connectors 34, 35 and 36 which can be selectively formed.

Figure 6:
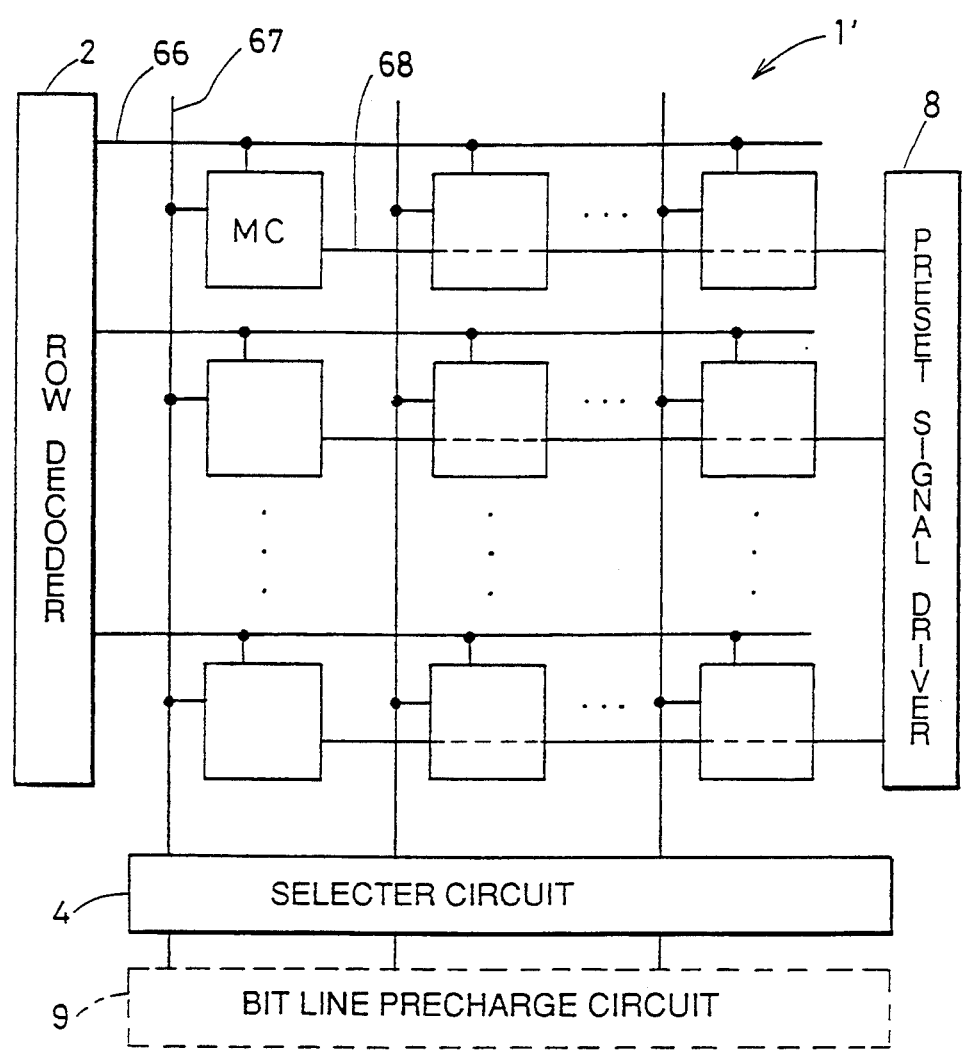
FIG. 6 is a circuit block diagram of a memory cell array to which the memory cell shown in FIG. 7 is applied.

FIG. 6 is a circuit block diagram of a memory cell array 1' to which memory cell 30a shown in FIG. 7 is applied. The word line WL, the bit line BL and the preset signal line DP all in FIG. 7 correspond to word line 66, bit line 67, and preset signal line 68 all shown in FIG. 6, respectively.

Figure 19:
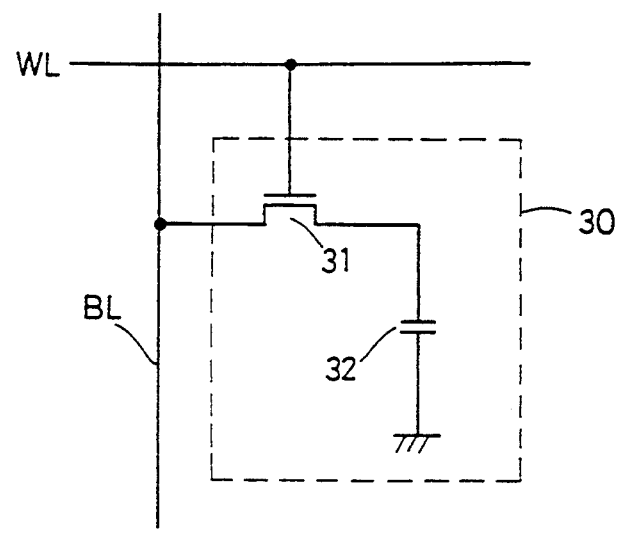
FIG. 19 is a schematic diagram of a circuit showing still another example of a memory cell in the conventional DRAM.

The preset operation in memory cell 30a shown in FIG. 7 can also be described with reference to the above-mentioned table 1. In case 1, connector 34 is not formed. Therefore, since one electrode of capacitor 32 is not connected to the drain of transistor 33, even if the data preset signal DP of a high level is applied, data stored in memory cell 30a is not changed. In case 1, the data writing operation and the data reading operation similar to those of memory cell 30 shown in FIG. 19 are carried out.

In case 2, connectors 34 and 36 are formed, while connector 35 is not formed. When the data preset signal DP of a high level is applied, transistor 33 is turned on. Therefore, since capacitor 32 is discharged, predetermined data "0" is written in capacitor 32. The written data is provided in the reading operation.

In case 3, connectors 34 and 35 are formed, while connector 36 is not formed. When the data preset signal DP of a high level is applied, the gate and the source of transistor 33 attain a high level. Since transistor 33 is turned on, capacitor 32 is charged by the high level voltage. Therefore, predetermined data "1" is written in capacitor 32, causing the written data to be provided in the reading operation.

Figure 8:
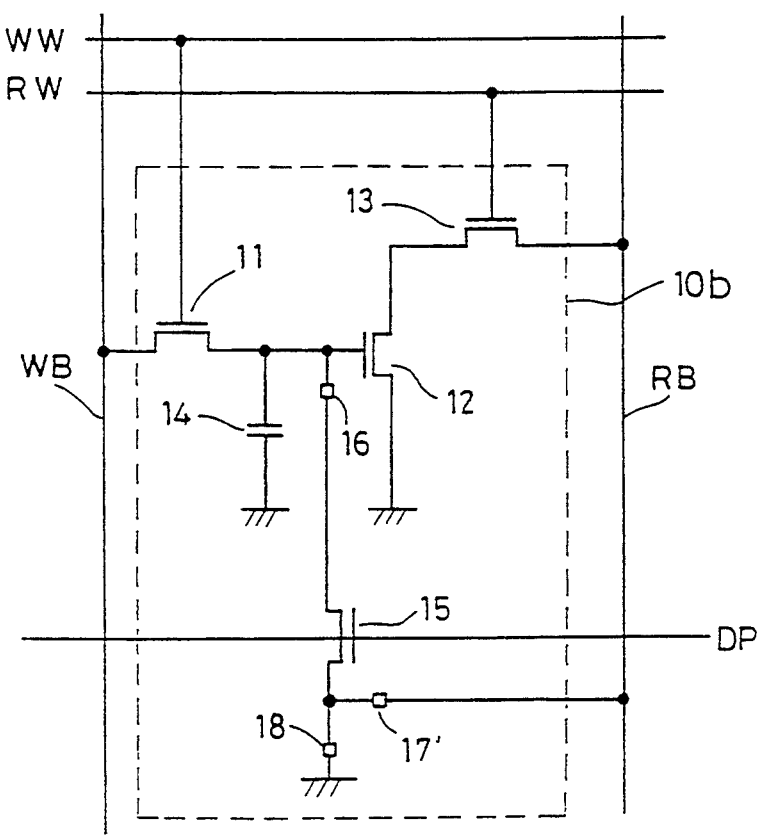
FIG. 8 is a schematic diagram of a circuit of a memory cell showing a further embodiment of the present invention.

FIG. 8 is a schematic diagram of a circuit of a memory cell showing a further embodiment of the present invention. Referring to FIG. 8, a memory cell 10b includes, as compared to memory cell 10a shown in FIG. 4, a connector 17' which can be selectively formed between the source of transistor 15 and the read bit line RB in place of connector 17.

In a data preset mode, the read bit line RB is precharged to a high level. In other words, in a period when the data preset signal DP of a high level is applied, the read bit line RB is brought to a high level. Control of the potential of the read bit line RB is carried out by a bit line precharge circuit 9 shown in FIG. 3. The data preset operation in memory cell 10b shown in FIG. 8 is also carried out in accordance with the before-mentioned table 1.

Figure 9:
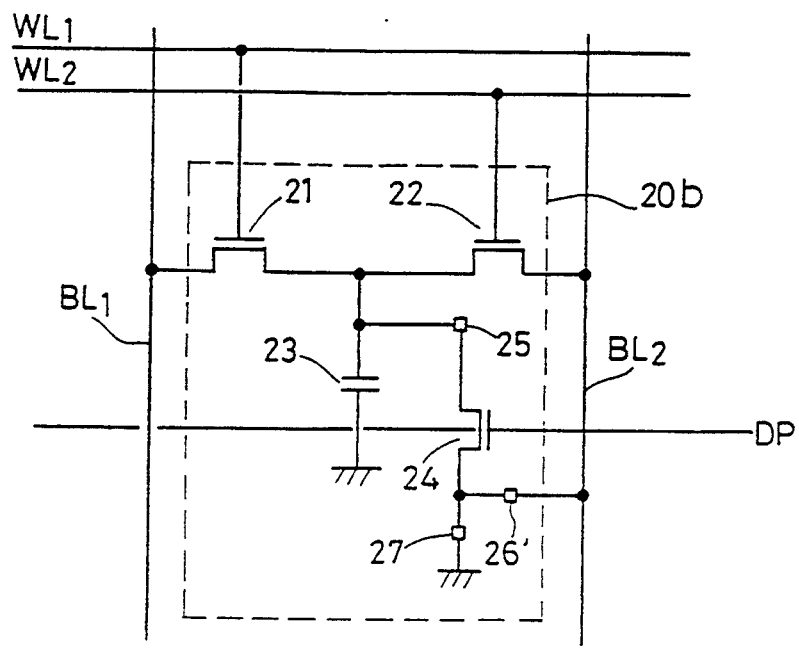
FIG. 9 is a schematic diagram of a circuit of a memory cell showing a further embodiment of the present invention.

FIG. 9 is a schematic diagram of a circuit of a memory cell showing a further embodiment of the present invention. Referring to FIG. 9, a memory cell 20b includes, as compared to memory cell 20a shown in FIG. 5, a connector 26' which can be selectively formed between the source of transistor 24 and the bit line BL2 in place of connector 26. Also in this embodiment, the bit line BL2 is precharged by bit line precharge circuit 9 shown in FIG. 3 in the data preset mode. Therefore, memory cell 20b also operates in accordance with the afore-mentioned table 1 similar to memory cell 20a shown in FIG. 5.

Figure 10:
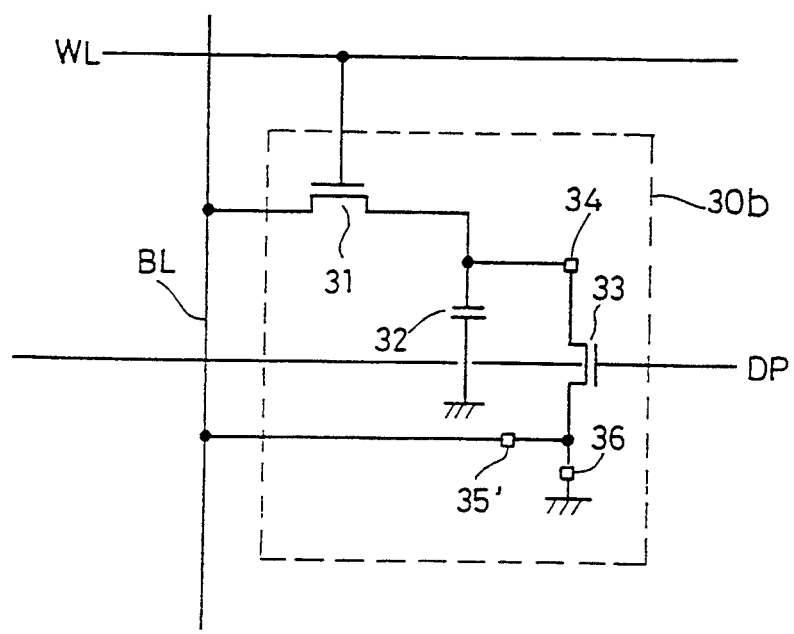
FIG. 10 is a schematic diagram of a circuit of a memory cell showing a further embodiment of the present invention.

FIG. 10 is a schematic diagram of a circuit of a memory cell showing a further embodiment of the present invention. Referring to FIG. 10, a memory cell 30b includes, as compared to memory cell 30a shown in FIG. 7, a connector 35' which can be selectively formed between the source of transistor 33 and the bit line BL in place of connector 35. Also in this embodiment, the bit line BL is precharged by bit line precharge circuit 9 shown in FIG. 16 in the data precharge mode. Therefore, memory cell 30b also operates in accordance with the afore-mentioned table 1 similar to memory cell 30a shown in FIG. 7.

Although embodiments in which 1-bit preset data can be programmed have been described above, embodiments in which 2-bit preset data can be programmed will be described hereinafter.

Figure 11:
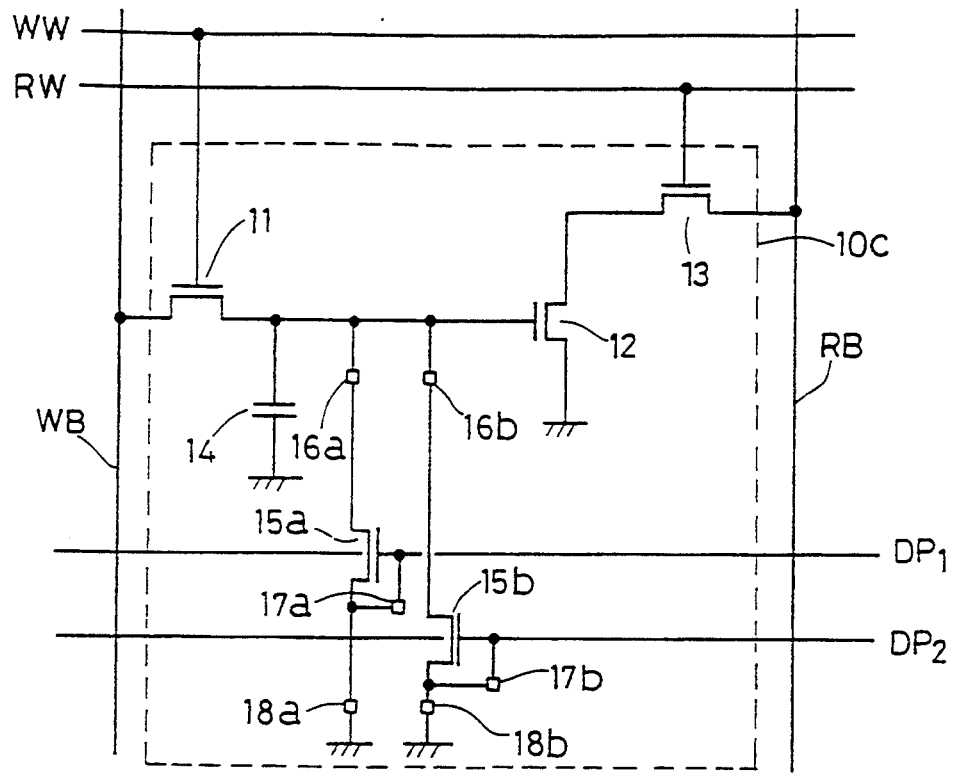
FIG. 11 is a schematic diagram of a circuit of a memory cell showing a further embodiment of the present invention.

FIG. 11 is a schematic diagram of a circuit of a memory cell showing a further embodiment of the present invention. Referring to FIG. 11, a memory cell 10c includes a group of an NMOS transistor 15a and connectors 16a, 17a and 18a, and a group of an NMOS transistor 15b and connectors 16b, 17b and 18b, in order to employ 2-bit preset data. Data precharge signals DP1 and DP2 each capable of being controlled independently are applied through two precharge signal lines.

The following table 2 shows the relation between provision of connectors and data to be programmed.

TABLE 2

| case | preset data | connector 16a, 25a, 34a | connector 17a, 26a, 35a | connector 18a, 27a, 36a | connector 16b, 25b, 34b | connector 17b, 26b, 35b | connector 18b, 27b, 36b |
| --- | --- | --- | --- | --- | --- | --- | --- |
| 1 | none | △ | — | — | △ | — | — |
| 2 | "0", "—" | ○ | △ | ○ | △ | — | — |
| 3 | "1", "—" | ○ | ○ | △ | △ | — | — |
| 4 | "1", "0" | ○ | ○ | △ | ○ | △ | ○ |
| 5 | "0", "1" | ○ | △ | ○ | ○ | ○ | △ |

Also in memory cell 10c shown in FIG. 11, although programming of preset data is basically similar to the afore-mentioned table 1, examples of programming are shown for several cases 1 to 5 in table 2. In case 1, neither connector 16a nor 16b is formed. Therefore, in case 1, memory cell 10c shown in FIG. 11 operates similarly to memory cell 10 shown in FIG. 17, regardless of the level of data preset signals DP1 and DP2.

In case 2, data "0" is programmed as first preset data, while second preset data is not programmed. Furthermore, in case 3, data "1" is programmed as first preset data, while second preset data is not programmed.

In case 4, data "1" is programmed as first preset data, while data "0" is programmed as second preset data. Furthermore, in case 5, data "0" is programmed as the first preset data, while data "1" is programmed as the second preset data. As shown in cases 4 and 5, two predetermined data can be programmed in memory cell 10c shown in FIG. 11. When the data preset signal DP1 of a high level is applied, capacitor 14 is charged or discharged in accordance with the first preset data programmed. On the other hand, when the data preset signal DP2 of a high level is applied, capacitor 14 is charged or discharged in accordance with the second preset data programmed.

Figure 12:
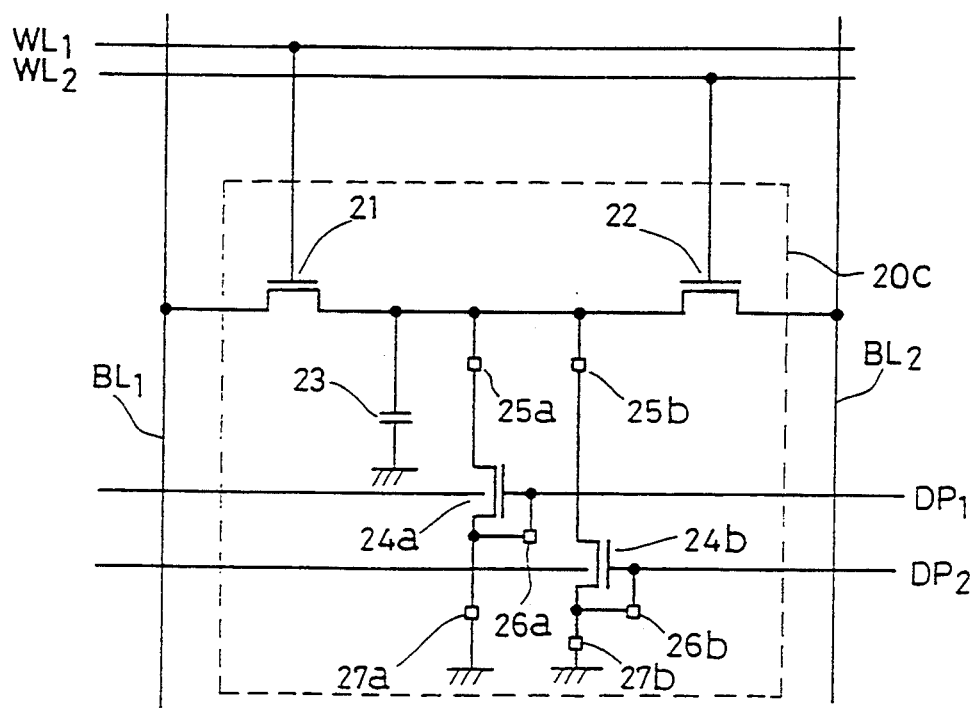
FIG. 12 is a schematic diagram of a circuit of a memory cell showing a further embodiment of the present invention.

FIG. 12 is a schematic diagram of a circuit of a memory cell showing a further embodiment of the present invention. Referring to FIG. 12, a memory cell 20c also includes a group of an NMOS transistor 24a and connectors 25a, 26a and 27a, and a group of an NMOS transistor 24b and connectors 25b, 26b and 27b, in order to employ two preset data. Also in this embodiment, two preset data can be programmed as shown in the aforementioned table 2.

Figure 13:
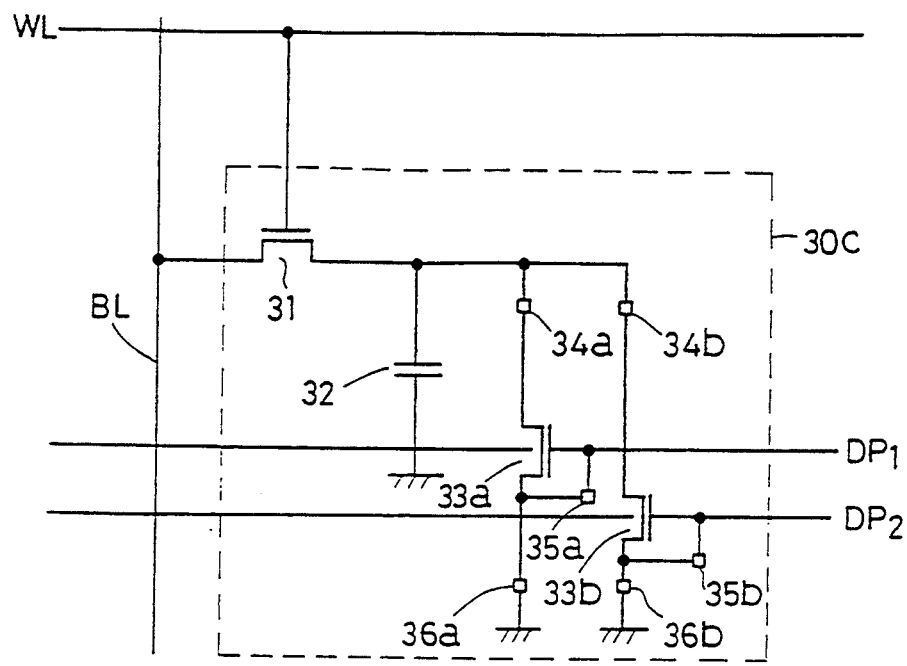
FIG. 13 is a schematic diagram of a circuit of a memory cell showing a further embodiment of the present invention.

FIG. 13 is a schematic diagram of a circuit of a memory cell showing a further embodiment of the present invention. Referring to FIG. 13, a memory cell 30c also includes a group of an NMOS transistor 33a and connectors 34a, 35a and 36a, and a group of an NMOS transistor 33b and connectors 34b, 35b and 36b, in order to employ two preset data. Also in this embodiment, two preset data can be programmed as shown in the aforementioned table 2.

Figure 14:
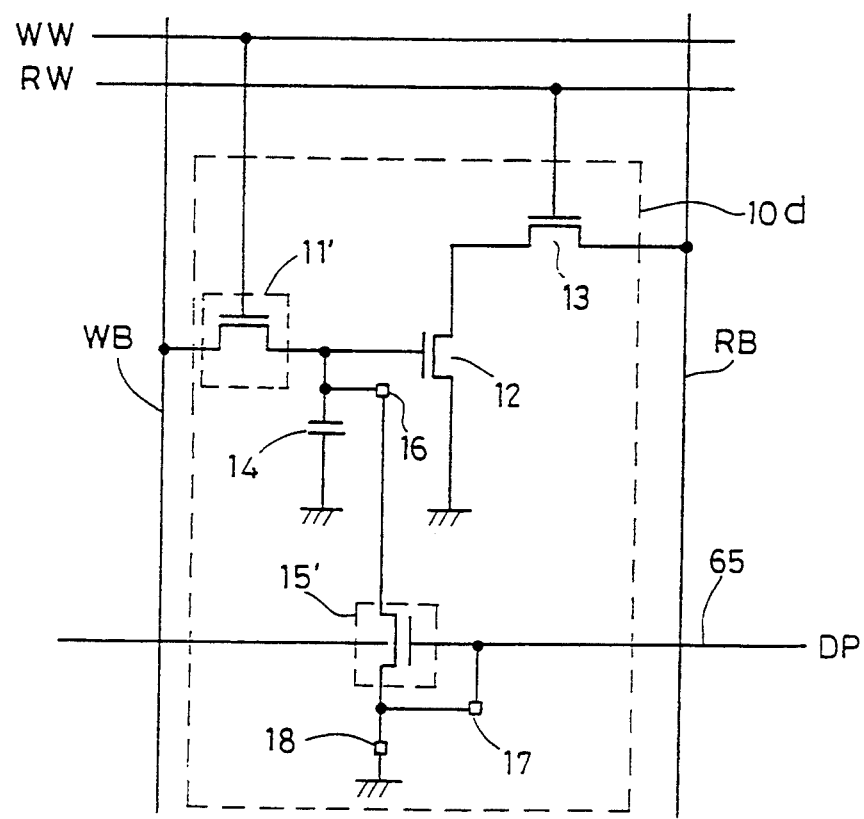
FIG. 14 is a schematic diagram of a circuit of a memory cell showing a further embodiment of the present invention.

FIG. 14 is a schematic diagram of a circuit of a memory cell showing a further embodiment of the present invention. Although a memory cell 10d shown in FIG. 14 has a circuit configuration similar to that of memory cell 10a shown in FIG. 4, a threshold voltage Vth of two transistors 11' and 15' is designed to be a value lower than that of transistors 11 and 15 shown in FIG. 4. When the potential of the write bit line WB is Vcc, capacitor 14 is charged by the reduced voltage Vcc −vth. On the other hand, also in the data preset mode, when the potential of preset signal line 65 is Vcc, capacitor 14 is charged by the reduced voltage Vcc −Vth. Therefore, by designing the threshold voltage Vth of transistors 11' and 15' to be lower, it becomes possible to charge capacitor 14 more sufficiently. By carrying out charge of capacitor 14 more sufficiently, it is possible to enhance data reading margin and data holding characteristics.

Figure 15:
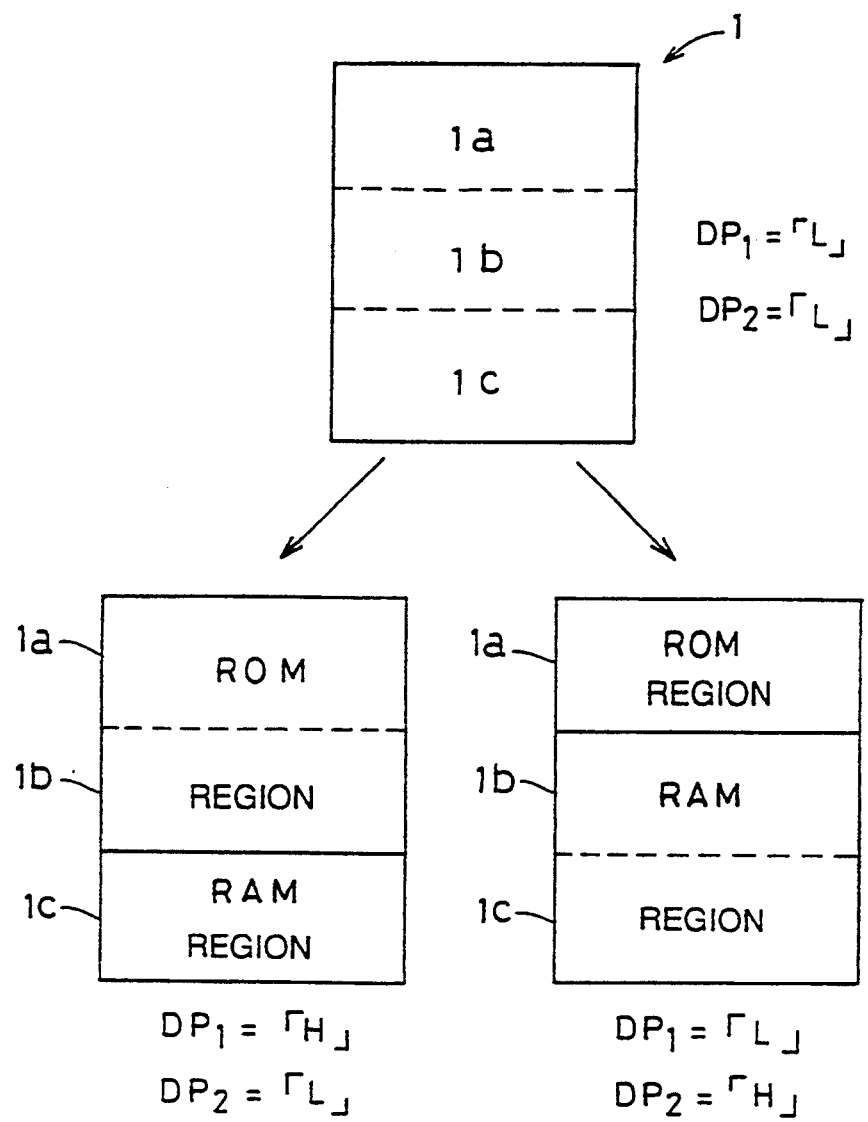
FIG. 15 is a block diagram showing one example of data storage regions configured by selective programming of preset data.

FIG. 15 is a block diagram showing an example of data storage regions in memory cell array 1 configured by selective programming of preset data. Referring to FIG. 15, memory cell array 1 is divided into three data storage regions 1a, 1b and 1c by selective programming of preset data. In other words, in region 1a, first and second preset data are programmed. In region 1b, only first preset data is programmed. In region 1c, none of the preset data is programmed.

When data preset signals DP1 and DP2 of both of a low level are applied, three data storage regions 1a, 1b and 1c operate as "RAM" whether or not they are programmed preset data. On the other hand, when the data preset signal DP1 of a high level and the data preset signal DP2 of a low level are applied, regions 1a and 1b serve as "ROM", and region 1c serves as "RAM". Furthermore, when the data preset signal DP1 of a low level and the data preset signal DP2 of a high level are applied, region 1a serves as "ROM", and regions 1b and 1c serve as "RAM".

As can be seen from FIG. 15, by selectively applying data preset signals DP1 and DP2, regions 1a, 1b and 1c in memory cell array 1 can be used as either "ROM" or "RAM". In other words, regions 1a, 1b and 1c in memory cell array 1 can be used as "ROM" or "RAM" by programing.

As can be seen from the above description, in the above-described embodiments, programming of preset data was carried out by selectively forming connectors in each memory cell. Connectors in these embodiments are formed by a contact hole or a through hole shown in FIG. 16(a) and 16(b).

Figure 16A:
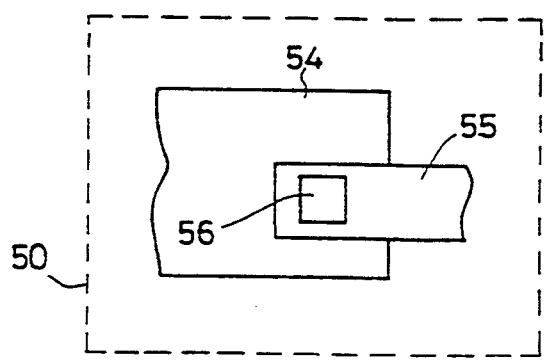
FIGS. 16(a) and 16(b) are layout diagrams on a semiconductor substrate of a contact hole or a through hole selectively formed as a connector in the embodiments.
Figure 16B:
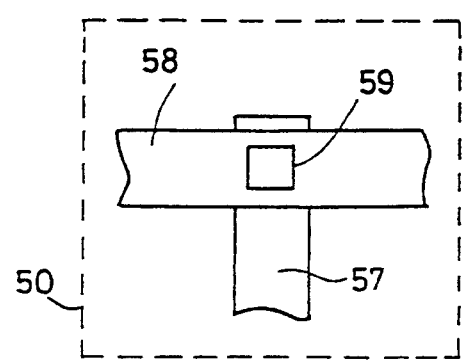

Referring to FIG. 16(a), a contact hole 56 as a connector connects a diffusion layer 54 formed in a semiconductor substrate 50 to a polysilicon interconnection 55. On the other hand, referring to FIG. 16(b), a through hole 59 as a connector connects a first metal interconnection layer 57 to a second metal interconnection layer 58. Contact hole 56 and through hole 59 as connectors are formed in the manufacturing steps of a semiconductor device. It becomes possible to selectively form connectors used in the above-described embodiments depending on whether or not contact hole 56 or through hole 59 is provided. It is pointed out that connectors can be implemented by a method other than the contact hole or through hole.

As described above, DRAM having a function as "ROM" as well can be provided by employing program using connectors and selective provision of a data preset signal. By applying such a DRAM as DRAM 40 in digital signal processing LSI device 51 shown in FIG. 1, it is possible to provide predetermined data required for display of color bar and/or cross hatch to digital signal processing circuit 44 quite easily. In examples where some conversion processing is carried out in digital signal processing circuit 44, data reversely converted in DRAM 40 is programmed as preset data.

Although a preset signal line is provided in each row in memory cell arrays 1 and 1' shown in FIGS. 3 and 6, it is pointed out that a preset signal line can be provided in each column depending on the cases.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A semiconductor memory, comprising:
   a memory cell array including a plurality of memory cells arranged in rows and columns;
   a plurality of word lines each provided in a corresponding one of the rows in said memory cell array and connected to memory cells in said corresponding one of the rows;
   a plurality of bit lines each provided in a corresponding one of the columns in said memory cell array and connected to memory cells in said corresponding one of the columns, wherein
each said memory cell includes
a capacitor for storing a data signal,
first switching means connected between a corresponding one of the bit lines and said capacitor and operated in response to a signal on a corresponding one of the word lines, and
predetermined data supplying means responsive to an externally applied preset requesting signal for supplying a predetermined data signal to said capacitor.

2. A semiconductor memory, comprising:
a memory cell array including a plurality of memory cells arranged in rows and columns;
a plurality of word lines each provided in a corresponding one of the rows in said memory cell array and connected to memory cells in said corresponding one of the rows;
a plurality of bit lines each provided in a corresponding one of the columns in said memory cell array and connected to memory cells in said corresponding one of the columns,
each said memory cell including
a capacitor for storing a data signal,
first switching means connected between a corresponding one of the bit lines and said capacitor and operated in response to a signal on a corresponding one of the word lines, and
predetermined data supplying means responsive to an externally applied preset requesting signal for supplying a predetermined data signal to said capacitor,
said predetermined data supplying means including
programming means for programming said predetermined data signal, and
charging/discharging means responsive to the externally applied preset requesting signal for charging or discharging said capacitor in accordance with said programming means.

3. The semiconductor memory according to claim 2, wherein said programming means includes circuit connection changing means for changing circuit connection in said memory cell in a manufacturing step to define said predetermined data.

4. The semiconductor memory according to claim 3, wherein
said charging/discharging means includes second switching means responsive to the externally applied preset requesting signal for selectively connecting one electrode of said capacitor to a charge potential or a discharge potential in accordance with said programming means.

5. The semiconductor memory according to claim 4, wherein
said second switching means includes a field effect transistor having the drain electrode connected to one electrode of said capacitor,
said circuit connection changing means includes
first connecting means for connecting the source electrode of said field effect transistor to a power supply potential, and
second connecting means for connecting the gate electrode of said field effect transistor to the source electrode,
said first and second connecting means being selectively carried out in accordance with said predetermined data, and
said field effect transistor receives said preset requesting signal through the gate electrode.

6. The semiconductor memory according to claim 4, wherein
said second switching means applies a charging potential applied through a corresponding one of the bit lines to one electrode of said capacitor in response to the externally applied preset requesting signal.

7. A semiconductor memory, comprising:
a memory cell array including a plurality of memory cells arranged in rows and columns;
a plurality of word lines each provided in a corresponding one of the rows in said memory cell array and connected to memory cells in said corresponding one of the rows;
a plurality of bit lines each provided in a corresponding one of the columns in said memory cell array and connected to memory cells in said corresponding one of the columns,
each said memory cell including
a capacitor for storing a data signal,
first switching means connected between a corresponding one of the bit lines and said capacitor and operated in response to a signal on a corresponding one of the word lines, and
predetermined data supplying means responsive to an externally applied preset requesting signal for supplying a predetermined data signal to said capacitor,
a plurality of preset signal lines each provided in a corresponding one of the rows in said memory cell array and connected to memory cells in said corresponding one of the rows; and
preset requesting signal supplying means responsive to the externally applied preset requesting signal for supplying an internal preset requesting signal to said plurality of preset signal lines,
said predetermined data supplying means supplying said predetermined data signal to said capacitor in response to the internal preset requesting signal applied through a corresponding one of the preset signal lines.

8. The semiconductor memory according to claim 7, wherein
said preset requesting signal supplying means includes preset signal line driving means responsive to the externally applied preset requesting signal for simultaneously driving said plurality of preset signal lines.

9. A semiconductor memory operating in first and second operation states, comprising:
a memory cell array including a plurality of memory cells arranged in rows and columns, wherein
said memory cell array is capable of storing arbitrary data and providing the stored data in said first operation state,
said memory cell array is capable of only providing predetermined data in said second operation state, said semiconductor memory further comprising
operation state control means responsive to an externally applied operation state control signal for controlling an operation state of said memory cell array.

10. The semiconductor memory according to claim 9, further comprising:
a plurality of word lines each provided in a corresponding one of the rows in said memory cell array and connected to memory cells in said corresponding one of the rows; and a plurality of bit lines each provided in a corresponding one of the columns in said memory cell array and connected to memory cells in said corresponding one of the columns, wherein each said memory cell includes a capacitor for storing a data signal, switching means connected between a corresponding one of the bit lines and said capacitor and operated in response to a signal on a corresponding one of the word lines, and predetermined data supplying means responsive to said operation state control means for supplying said predetermined data signal to said capacitor.

11. A semiconductor memory operating in first and second operation states, comprising:

a memory cell array including a plurality of memory cells arranged in rows and columns, wherein said memory cell array is capable of storing arbitrary data and providing the stored data in said first operation state, said memory cell array is capable of only providing predetermined data in said second operation state, said semiconductor memory further comprising operation state control means responsive to an externally applied operation state control signal for controlling an operation state of said memory cell array, a plurality of word lines each provided in a corresponding one of the rows in said memory cell array and connected to memory cells in said corresponding one of the rows; and a plurality of bit lines each provided in a corresponding one of the columns in said memory cell array and connected to memory cells in said corresponding one of the columns, wherein each said memory cell includes a capacitor for storing a data signal, switching means connected between a corresponding one of the bit lines and said capacitor and operated in response to a signal on a corresponding one of the word lines, and predetermined data supplying means responsive to said operation state control means for supplying said predetermined data signal to said capacitor, and said operation state control means includes a plurality of preset signal lines each provided in a corresponding one of the rows in said memory cell array and connected to memory cells in said corresponding one of the rows, and preset requesting signal supplying means responsive to the externally applied operation state control signal for supplying a preset requesting signal to said plurality of preset signal lines, said predetermined data supplying means supplies said predetermined data signal to said capacitor in response to the preset requesting signal applied through a corresponding one of the preset signal lines.

12. The semiconductor memory according to claim 11, wherein said preset requesting signal supplying means includes preset signal line driving means responsive to the externally applied preset requesting signal for simultaneously driving said plurality of preset signal lines.

13. A semiconductor memory, comprising:

a memory cell;

first and second word lines connected to said memory cell;

first and second bit lines connected to said memory cell, wherein said memory cell includes a capacitor for storing a data signal, first switching element connected between said first bit line and said capacitor and operated in response to a signal on said first word line, second switching element coupled between said second bit line and said capacitor and operated in response to a signal on said second word line, predetermined data supplying means responsive to an externally applied preset requesting signal for supplying a predetermined data signal to said capacitor.

14. The semiconductor memory according to claim 13, wherein said first and second switching elements are first and second field effect transistors, respectively, said capacitor has the first electrode grounded, said second field effect transistor is connected between said first bit line and the second electrode of said capacitor, and said second field effect transistor is coupled between said second bit line and the second electrode of said capacitor.

15. A semiconductor memory, comprising:

a memory cell;

first and second word lines connected to said memory cell; and first and second bit lines connected to said memory cell, wherein said memory cell includes a capacitor for storing a data signal, first switching element connected between said first bit line and said capacitor and operated in response to a signal on said first word line, second switching element coupled between said second bit line and said capacitor and operated in response to a signal on said first word line, and predetermined data supplying means responsive to an externally applied preset requesting signal for supplying a predetermined data signal to said capacitor, said first and second switching elements are first and second field effect transistors, respectively, said capacitor has the first electrode grounded, said second field effect transistor is connected between said first bit line and the second electrode of said capacitor, said second field effect transistor is coupled between said second bit line and the second electrode of said capacitor, and said predetermined data supplying means includes a third field effect transistor connected between said second field effect transistor and the ground, said third field effect transistor having the gate electrode connected to the second electrode of said capacitor, first connecting means for connecting the source electrode of said third field effect transistor to a ground potential, and second connecting means for connecting the gate electrode of said third field effect transistor to the source electrode, said first and second connecting means are selectively carried out in accordance with said predetermined data, and said third field effect transistor receives said preset requesting signal through the gate electrode.

16. The semiconductor memory according to claim 15, wherein said first word line includes a write word line activated in a data writing operation, said second word line includes a read word line activated in a data reading operation, said first bit line includes a write bit line transmitting a data signal to be stored in said memory cell, and said second bit line includes a read bit line transmitting a data signal provided from said memory cell.

* * * * *